United States Patent
Kikuchi et al.

(10) Patent No.: US 6,372,054 B1
(45) Date of Patent: Apr. 16, 2002

(54) PROCESS FOR PRODUCING ULTRAFINE MULTIFILAMENTARY $NB_3(A1,GE)$ OR $NB_3(A1,SI)$ SUPERCONDUCTING WIRE

(75) Inventors: Akihiro Kikuchi; Yasuo Iijima; Kiyoshi Inoue, all of Ibaraki (JP)

(73) Assignee: Japan as represented by Director General of National Research Institute for Metals, Tsukuba (JP)

( * ) Notice: Subject to any disclaimer, the term of this patent is extended or adjusted under 35 U.S.C. 154(b) by 0 days.

(21) Appl. No.: 09/585,419

(22) Filed: Jun. 2, 2000

(30) Foreign Application Priority Data

Jun. 4, 1999 (JP) ............................. 11-158826

(51) Int. Cl.[7] .............................................. H01B 12/00
(52) U.S. Cl. ......................... 148/98; 505/918; 505/919
(58) Field of Search ...................... 148/96, 98; 505/918, 505/919, 920

(56) References Cited

U.S. PATENT DOCUMENTS

| | | | |
|---|---|---|---|
| 4,018,942 A | * | 4/1977 | Muller et al. ................ 148/98 |
| 4,223,434 A | * | 9/1980 | Wang et al. ................. 148/98 |
| 4,321,749 A | * | 3/1982 | Tachikawa et al. ........... 148/98 |
| 5,362,331 A | * | 11/1994 | Tada et al. .................. 148/96 |

* cited by examiner

*Primary Examiner*—George Wyszomierski
(74) *Attorney, Agent, or Firm*—Wenderoth, Lind & Ponack, L.L.P.

(57) ABSTRACT

A process for producing an ultrafine multifilamentary superconducting $Nb_3(Al,Ge)$ wire capable of generating a high critical current density comprising: preparing a composite core material comprising an Al—(2–30)at. % Ge alloy (where at. % represents % by atomic) 1 μm or less in thickness uniformly incorporated into a Nb matrix at a volume ratio in a range of 1:2.5 to 1:3.5 and forming a composite therewith; fabricating a composite wire having an ultrafine multifilamentary structure by embedding several tens to several millions of the resulting composite core materials in a cylindrical matrix material containing Nb; forming a A15-phase filament having a lower order in crystallinity inside the composite wire by a rapid heating and quenching treatment comprising rapidly heating to a temperature of 1,700° C. or higher in 2 seconds, followed by continuously introducing it into a molten metal; coating the composite wire with copper (Cu) which functions as a superconductivity stabilizing material; and applying a post heat treatment in the temperature range of from 650 to 900° C. to the resulting product to recover the degree of crystallinity of the $Nb_3(Al,Ge)$ in the A15 compound.

8 Claims, 13 Drawing Sheets

1 a wire material
2 a supply reel
3 a guide roller
4 an electrode pulley
5 an immersing guide roller
6 a taking up reel
7 an immersion tank
8 Ga bath
9 a power source
10 a wire
11 a diffraction recorder unit
12 wires for applying heating voltage
13 wires for applying heating current
14 a wire

PROCESS FOR PRODUCING ULTRAFINE MULTIFILAMENTARY NB₃(A1,GE) OR NB₃(A1,SI) SUPERCONDUCTING WIRE

BACKGROUND OF THE INVENTION

1. Field of the Invention

The present invention relates to an ultrafine multifilamentary Nb₃Al superconducting wire improved in characteristics by adding Ge or Si, and provides a process for producing an ultrafine multifilamentary superconducting Nb/Al compound wire into which Ge or Si is added.

2. Description of the Related Art

It has long been known that Nb₃(Al,Ge) or Nb₃(Al,Si) produced by arc melting yield a superconducting critical temperature $T_C$ and a superconducting critical magnetic field $H_{C2}$ far higher than those of Nb₃Al.

Figure 13:
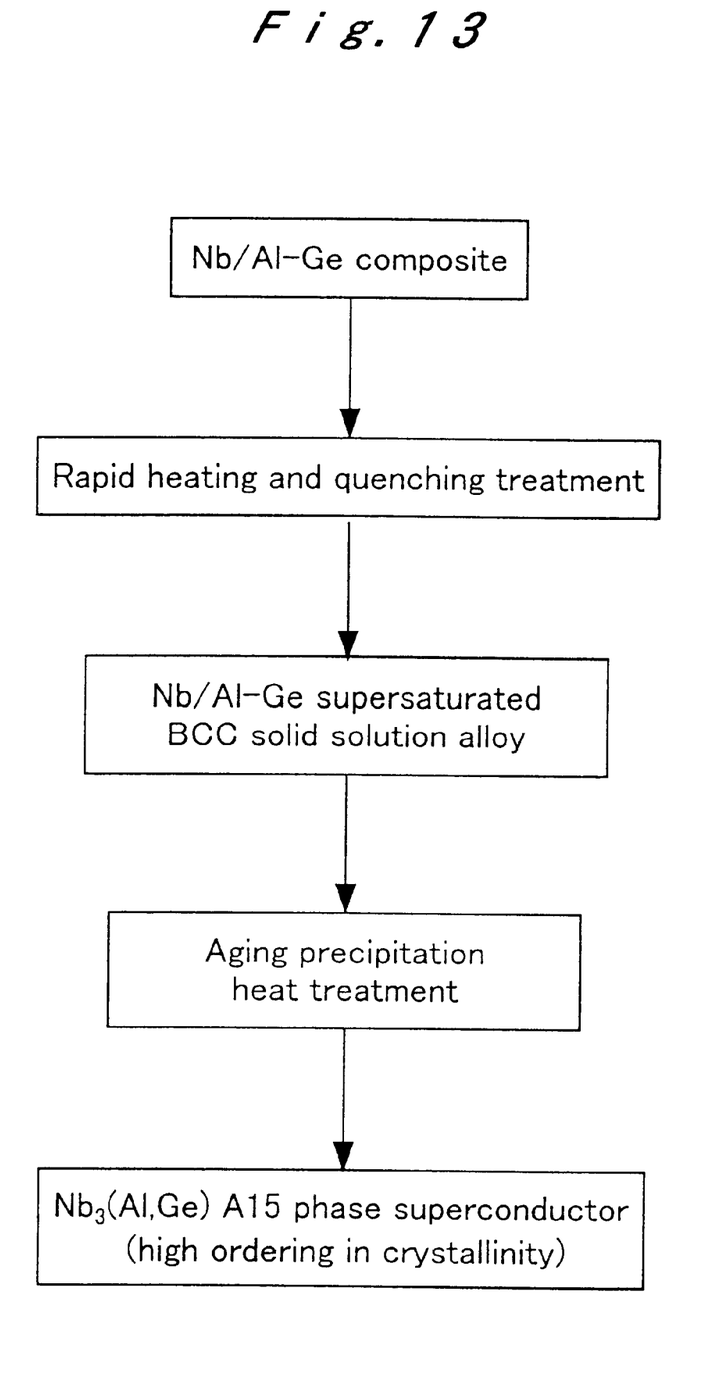
FIG. 13 is a schematically drawn process flow of a conventional method using rapid heating and quenching.

In utilizing a production method as shown schematically in FIG. 13, recently proposed is a production process comprising subjecting a composite wire material of Nb and Al to a rapid hating and quenching treatment to thereby form a solid solution phase supersaturated with a bcc Nb-25 at. % Al alloy (the term "at. %" as referred herein signifies "% by atomic") in the composite wire material, and then subjecting the resulting product to heat treatment in the temperature range of from 650 to 900° C. In this manner, it is possible to deposition superfine crystals of Nb₃Al precipitates near to stoichiometric composition. Since the resulting product enables an extremely high critical current density $J_C$, this method is attracting attention in producing practically useful wire material.

Since the highest magnetic field generated by using a metallic superconducting wire material on record is 21.7 T, the upper limit attainable in generated magnetic field using a practical Nb₃Al wire material is presumably about 23.5 T.

An oxide superconducting wire material enables the generation of a higher magnetic field, however, it disadvantageously requires a production cost about 100 times as large as necessary for producing a metallic superconducting wire material.

Concerning the method for producing a metallic superconducting wire material, on the other hand, there is known a production method comprising preparing an ultrafine multifilamentary composite wire comprising an Al—Ge alloy core embedded in a Nb matrix, and subjecting the wire to a rapid heating and quenching treatment comprising rapidly heating the wire to a temperature of ca. 2,000° C. by resistive heating and continuously introducing it to a molten metal. In this manner, provided that the addition of Ge into Al is as small as 2% or less, a supersaturated solid solution is generated in the resulting composite wire, and by applying a post precipitation heat treatment thereto, the resulting product enables a high $J_C$, but there is no considerable increase in $T_C$ and $H_{C2}$.

On the other hand, if the amount of added Ge increases, the supersaturated solid solution becomes unstable, and the production of a supersaturated solid solution becomes available only under super quenching conditions.

However, the production process above is practically unfeasible because continuous super quenching is extremely difficult in an industrial production.

SUMMARY OF THE INVENTION

In the light of the aforementioned circumstances, in accordance with an aspect the present invention, there is provided a process for producing an ultrafine multifilamentary superconducting Nb₃(Al,Ge) wire comprising: preparing a composite core material comprising an Al—(2–30)at. % Ge alloy (where at. % represents % by atomic) 1 µm or less in thickness uniformly incorporated into a Nb matrix at a volume ratio in a range of 1:2.5 to 1:3.5 and forming a composite therewith; fabricating a composite wire having an ultrafine multifilamentary structure by embedding a plurality of the resulting composite core materials in a cylindrical matrix material containing Nb; forming a A15-phase filament having a lower order in crystallinity inside the composite wire having the ultrafine multifilamentary structure by a rapid heating and quenching treatment comprising rapidly heating the composite wire having the ultrafine multifilamentary structure to a temperature of 1,700° C. or higher in 2 seconds, followed by continuously introducing it into a molten metal; coating the composite wire having the ultrafine multifilamentary structure in the state above with copper (Cu) which functions as a superconductivity stabilizing material; and applying a post heat treatment in the temperature range of from 650 to 900° C. to the resulting product to recover the degree of crystallinity of the Nb₃(Al, Ge) in the A15 phase compound (claim 1).

According to another aspect of the present invention, there is provided a process for producing an ultrafine multifilamentary superconducting Nb₃(Al,Si) wire, comprising the same process steps as claimed in claim 1, except for using an Al—(2–20)at. % Si alloy (where at. % represents % by atomic) as the starting material in the place of the Al—(2–30)at. % Ge alloy (claim 2).

In accordance with still other aspects of the present invention, there are provided processes for producing an ultrafine multifilamentary superconducting Nb₃(Al,Ge) wire or Nb₃(Al,Si) wire as claimed in claim 1 or claim 2, wherein instead of coating the composite wire with copper (Cu) prior to the additional heat treatment, the step of Cu coating for stabilizing superconductivity is performed after the additional heat treatment (claim 3); a process for producing an ultrafine multifilamentary superconducting Nb₃(Al,Ge) wire or Nb₃(Al,Si) wire as claimed in claim 1 or claim 2, wherein copper (Cu) is surrounded beforehand with a diffusion barrier material and then embedded into the matrix material, followed by wire drawing to fabricate the composite wire having the ultrafine multifilamentary structure, and subjecting the resulting composite wire to the rapid heating and quenching treatment (claim 4); or a process for producing an ultrafine multifilamentary superconducting Nb₃(Al,Ge) wire or Nb₃(Al,Si) wire as claimed in one of claims 1, 2, 3, or 4, wherein an alloy expressed by Al—(2–30) at. % Ge—(0–7) at. % X or Al—(2 –20) at. % Si—(0–7)at. % X (where at. % represents % by atomic), where X represents at least one element selected from the group consisting of Mg, Zn, Li, Ag, Cu, and B, is used as the starting material in the place of the Al—(2–30)at. % Ge alloy or the Al—(2–20)at. % Si alloy (claim 5).

The present invention has been accomplished based on the following findings of the present invention.

On carrying out the rapid heating and quenching treatment on a conventional Al—Ge core material embedded in Nb matrix as described above, filaments of A15 phase compounds having a low degree of ordering in crystallinity are formed, but by subjecting them to a heat treatment in the temperature range of from 650 to 900° C., the long range ordering is recovered to yield a $T_C$ of 19.4 K and a $H_{C2}$ (4.2 K) of 39.5 T. However, this product yields a $J_C$(4.2 K) of 130 A/mm² at 15 T, a value somewhat inferior as compared with that of a practical wire material. Still, a decrease in $J_C$ with increasing magnetic field for the material above of the product is small, and the $J_C$(4.2 K) under a magnetic field of 25 T is about 100 A/mm$^2$, i.e., the highest among the metallic superconducting wire materials. However, a practical wire was still unfeasible because a $J_C$(4.2 K) of at least 150 A/mm$^2$ was necessary for use as a practical superconducting magnet at the targeted magnetic field.

The present inventors successfully fabricated a composite ultrafine multifilamentary wire comprising an Al—Ge alloy core reduced in diameter from the conventional 1.5 μm to 0.3 μm, and, on applying a rapid heating and quenching treatment to the composite wire, a $J_C$(4.2 K) of over 250 A/mm$^2$ was finally attained under 21 T, and a value of 150 A/mm$^2$ was achieved at 25 T.

From the fact above, it was understood that, presumably, by optimally designing a superconducting magnet using the Nb$_3$(Al,Ge) ultrafine multifilamentary wire material above, it is possible to generate a magnetic field of 25 T under the operation at 4.2 K and 27 T under the operation at 1.8 K (that is, cooling from 4.2 K to 1.8 K improves the superconductivity by about 2 T).

In the case of adding Si to Al, the $T_C$ and $H_{C2}$(4.2 K) were similarly improved. Although there was confronted with a problem of low $J_C$ in this case due to the rapid heating and quenching treatment which led to the formation of an unstable supersaturated solid solution and of an A15 phase compound having a low degree of crystallinity, an increase in $J_C$ was achieved by similarly reducing the diameter of the Al—Si alloy core.

The invention disclosed in this application has been accomplished based on the findings above, and it proposes a novel fabrication process for obtaining high $J_C$ in an ultrafine multifilamentary Nb$_3$Al wire improved in $T_C$ and $H_{C2}$ by adding Ge or Si.

The superconducting wire material according to the present invention fabricated by the production process described in the present application enables a generation of an intense magnetic field in the level of 27 T.

DESCRIPTION OF THE PREFERRED EMBODIMENTS

Figure 9:
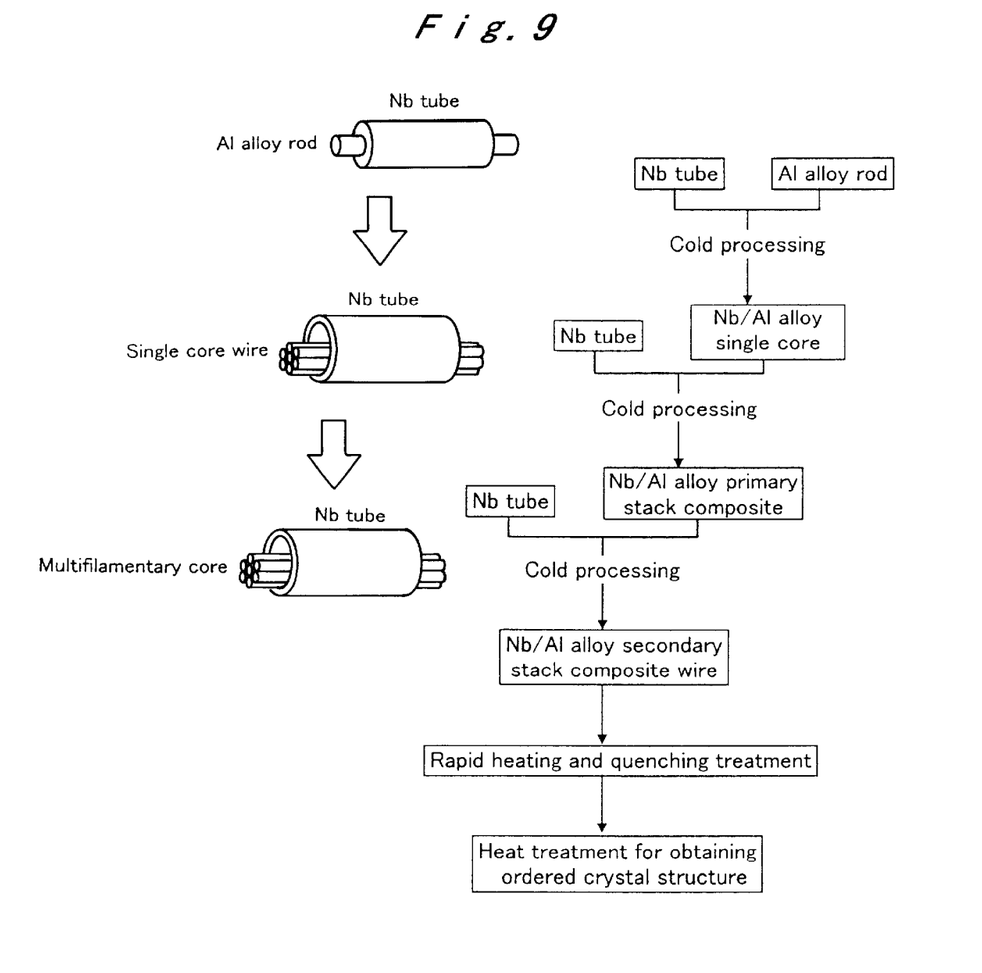
FIG. 9 is a schematically drawn process flow of a rod-in-tube method which is one of the methods for processing a composite Nb/Al alloy wire material.
Figure 10:
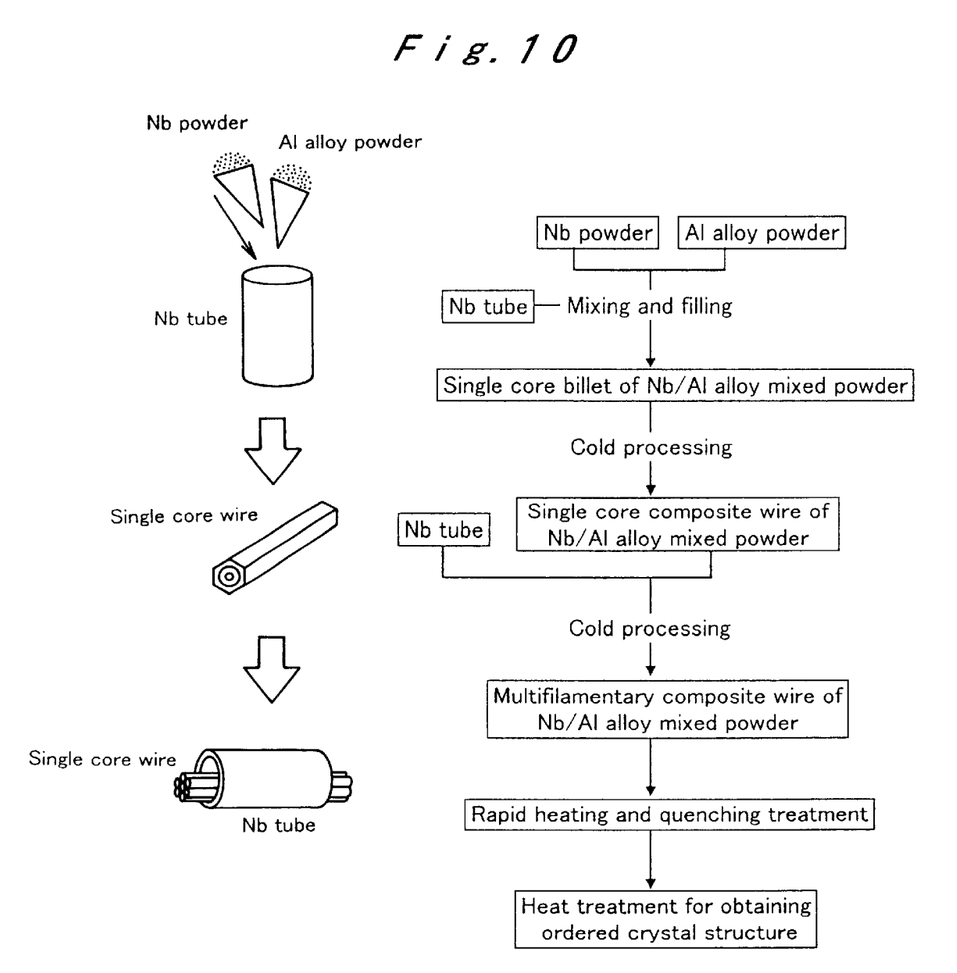
FIG. 10 is a schematically drawn process flow of a powder-in-tube method which is one of the methods for processing a composite Nb/Al alloy wire material.
Figure 11:
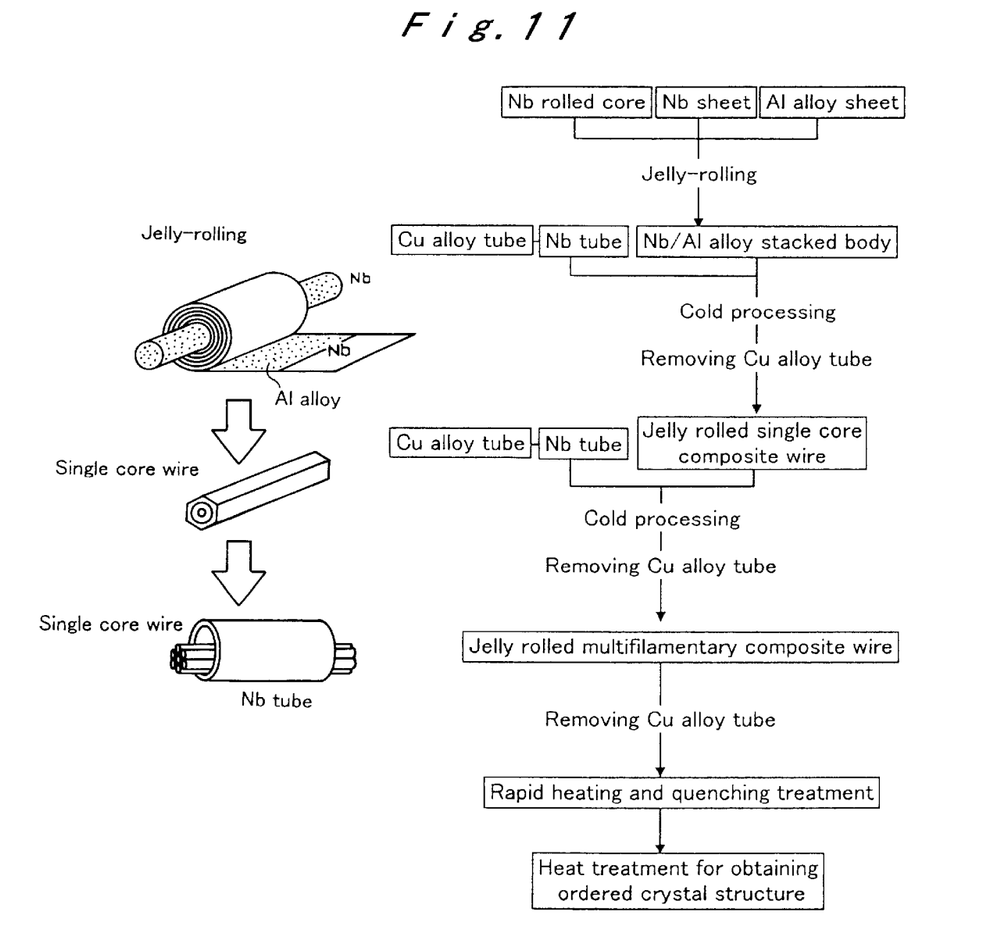
FIG. 11 is a schematically drawn process flow of a Jelly roll method which is one of the methods for processing a composite Nb/Al alloy wire material.
Figure 12:
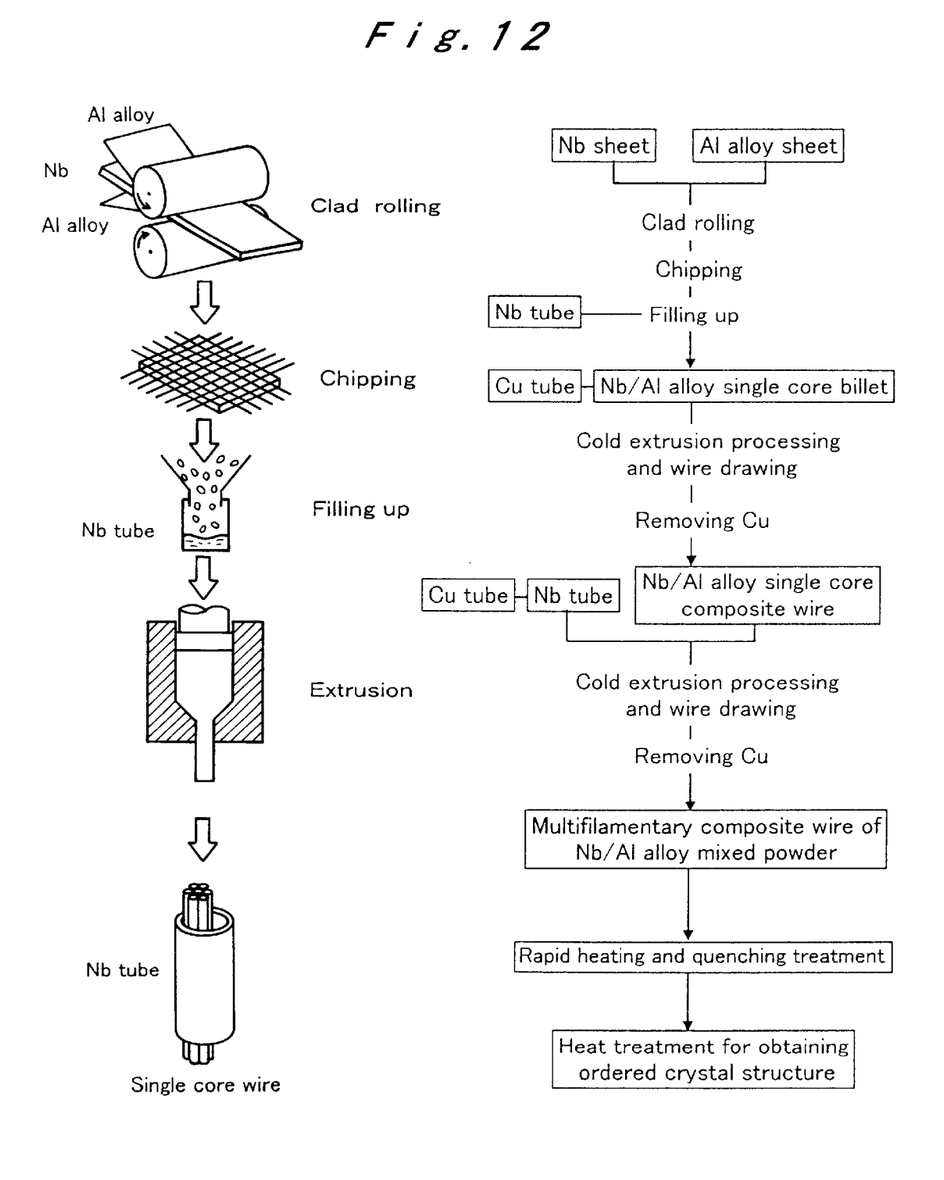
FIG. 12 is a schematically drawn process flow of a cladded chip/extrusion method which is one of the methods for processing a composite Nb/Al alloy wire material.

Concerning the embodiment for the fabrication of Nb/Al alloy micro composite core, the following example employs a rod-in-tube process, with reference to FIG. 9, comprising inserting a core rod of Al alloy into a Nb tube, wire drawing, and repeating insert a plurality core rod of Nb/Al composite into a Nb tube and wire drawin. It is also possible to employ a powder-in-tube process comprising wire drawing a powder mixture prepared by mixing an Nb powder with an Al alloy powder as shown in FIG. 10; or a Jelly roll process comprising wire drawing a composite prepared by rolling a Nb sheet superposed on an Al alloy sheet as shown in FIG. 11; or a cladded chip/extrusion process as shown in FIG. 12, comprising applying a light processing to an Al alloy sheet superposed on a Nb sheet, followed by cutting the resulting product into rectangular chips of a proper size and subjecting them to extrusion. In principle, the micro composites fabricated by any of the processes above are the same concerning their characteristics.

The Al alloy thus obtained should be 1 μm or less in thickness. An Al alloy 1 μm or more in thickness yields a practically disadvantageous inferior $J_C$(4.2 K) value under a low applied magnetic field.

Concerning the alloy ratio of the micro composite, the Al—(2–30)at. % Ge alloy to Nb ratio by volume is in a range of from 1:2.5 to 1:3.5. This ratio is based on the fact that the core material has a stoichiometric ratio of Nb to Al alloy of 3:1, and, a superconductive A15 phase compound generates so long as the Nb to Al alloy compositional ratio falls in the vicinity of stoichiometry. If the ratio above falls far out of 3:1, other non-superconducting compounds and non-superconducting alloys tend to account for a larger quantity, and this leads to the formation of other compounds. In the example below, the Nb to Al—(2–30 ) at. % Ge alloy ratio is fixed to 3:1, but no practical problem arises even if the composition fluctuates from the ratio above.

The amount of addition for Ge or Si is set as such that Ge or Si accounts for 2% by atomic or more in Al. If the addition of Ge or Si is less than 2% by atomic, the supersaturated bcc solid solution generates preferentially in the alloy, and this is the same process as that disclosed in the previous patent No. 2,762,074.

The best effect concerning the amount of addition for Ge or Si to Al is realized when an amount of 20% by atomic of Ge or 10% by atomic of Si is added. An addition in excess gradually deteriorates the superconducting characteristics of the resulting product.

Rapid heating and quenching treatment in the example is performed by taking the transportation speed of the wire material, i.e., 1 m/sec, as the standard. In this case, the duration of heating is 0.1 sec. There is no considerable difference in superconducting characteristics even if the transportation speed of the wire material is slowed down to 0.5 m/sec or 0.2 m/sec. However, a transportation speed as low as 0.05 m/sec or lower is not preferred for the rapid heating and quenching treatment of long wire materials, because the amount of Nb dissolved in a molten metal such as Ga bath increases as to make the process unsuitable. In this manner, a molten metal maintained in the temperature range of from the melting point of it or higher to around 300° C. or lower is preferable for prevention of the remarkable reaction and erosion to a metal composing the wire material or the rapid heating and heating apparatus.

Moreover, a longer duration of heat treatment in the rapid heating and quenching treatment is not preferred because it leads to the decrease in cooling rate. In practice, a heating for a duration of 0.1 sec is sufficient.

As the matrix, pure Nb is used in the example below, because pure Nb resists to a temperature of 1,700° C. or higher, exhibits favorable cold processing properties, and has poor diffusion reactivity with $Nb_3Al$. As other materials which satisfy the requirements above, there can be mentioned pure Ta, a Nb based alloy, and a Ta based alloy, and are applicable to use as a matrix.

Concerning the starting material to be subjected to the processing, used in the example are an Al—Ge alloy and a Al—Si alloy. However, from the knowledge obtained so far, the alloys may contain, without any problem, Mg, Ag, Cu, B, and Li up to 7% by atomic in total. In case the alloys contain 7% by atomic or less of the above Mg and the like, the processability in fabricating the composite is improved without any problem, free from any negative effects on the superconductivity.

As for the post heat treatment, in the example below, it is performed at 800° C., but the heat treatment is not limited thereto, and is carried out at a temperature in the range of from 650 to 900° C. By applying the post heat treatment at a temperature in this range, the ordering in crystallinity of $Nb_3(Al,Ge)$ in the A15 phase compound can be recovered.

The Cu coating used as a stabilizing material can be provided by any means selected from electroplating, chemical plating, physical plating, etc. Furthermore, the coating may be formed either before or after the post heat treatment.

The embodiment of the present invention is described in further detail below by making reference to some examples.

EXAMPLES

Example 1

An example of adding Ge is described below with reference to FIGS. 2 and 9.

Al alloys containing 5 at. % Ge, 20 at. % Ge, 30 at. % Ge, and 40 at. % Ge (referred to hereinafter as Al—5 at. % Ge, Al—20 at. % Ge, Al—30 at. % Ge, Al—40 at. % Ge, respectively) were each prepared by Tanmann melting and cutting into rods each 7 mm in outer diameter, and were each inserted into Nb pipes (14 mm in outer diameter and 7 mm in inner diameter). The resulting specimens were each subjected to cold groove rolling and wire drawing processes while applying granulation heat treatment at 390° C. In this manner, composite rod materials were prepared as such that Al—(2–30)at. % Ge 1 μm or less in thickness might be uniformly incorporated in Nb matrix at a volume ratio of 1:3.

Composite processing was unsuccessful for the Al—40 at. % Ge alloy because cracks generated in the initial stage of processing and breakage occurred during wire drawing.

For the specimens containing 30 at. % or less Ge, composite processing was successfully performed; wire drawing was applied to some of the composite wires until a diameter of 1.14 mm was achieved, and the rest were drawn to obtain composite wires 0.8 mm in diameter.

Subsequent to wire drawing, the single core composite wires were each cut to a pertinent size. In the case of 1.14 mm diameter single core wires, 121 wires were bundled and inserted into a Nb pipe (20 mm in outer diameter and 14 mm in inner diameter), whereas 330 single core wires 0.8 mm in diameter were bundled and inserted into a Nb pipe (25 mm in outer diameter and 16 mm in inner diameter). The resulting products were each subjected to groove rolling and wire drawing without applying intermediate annealing. Thus, the 121 multifilamentary composite wires were processed to obtain 1.14 mm diameter wires, cut, and 121 resulting wires were bundled up again, and inserted into a Nb pipe (20 mm in outer diameter and 14 mm in inner diameter). The 330 multifilamentary composite wires were processed to obtain 0.8 mm diameter wires, cut, and 330 resulting wires were bundled up again, and inserted into a Nb pipe (25 mm in outer diameter and 16 mm in inner diameter). Thus obtained 121×121 multifilamentary composite and the 330×330 multifilamentary composite were each processed into 0.8-mm diameter composite wires by groove rolling and wire drawing. Thus were obtained ultrafine multifilamentary composite wires comprising multiple composite core materials embedded in pure Nb matrix.

The final product comprises a plurality of composites embedded in the matrix, and, the term "a plurality" as referred herein generally signifies several tens to several millions.

Figure 1:
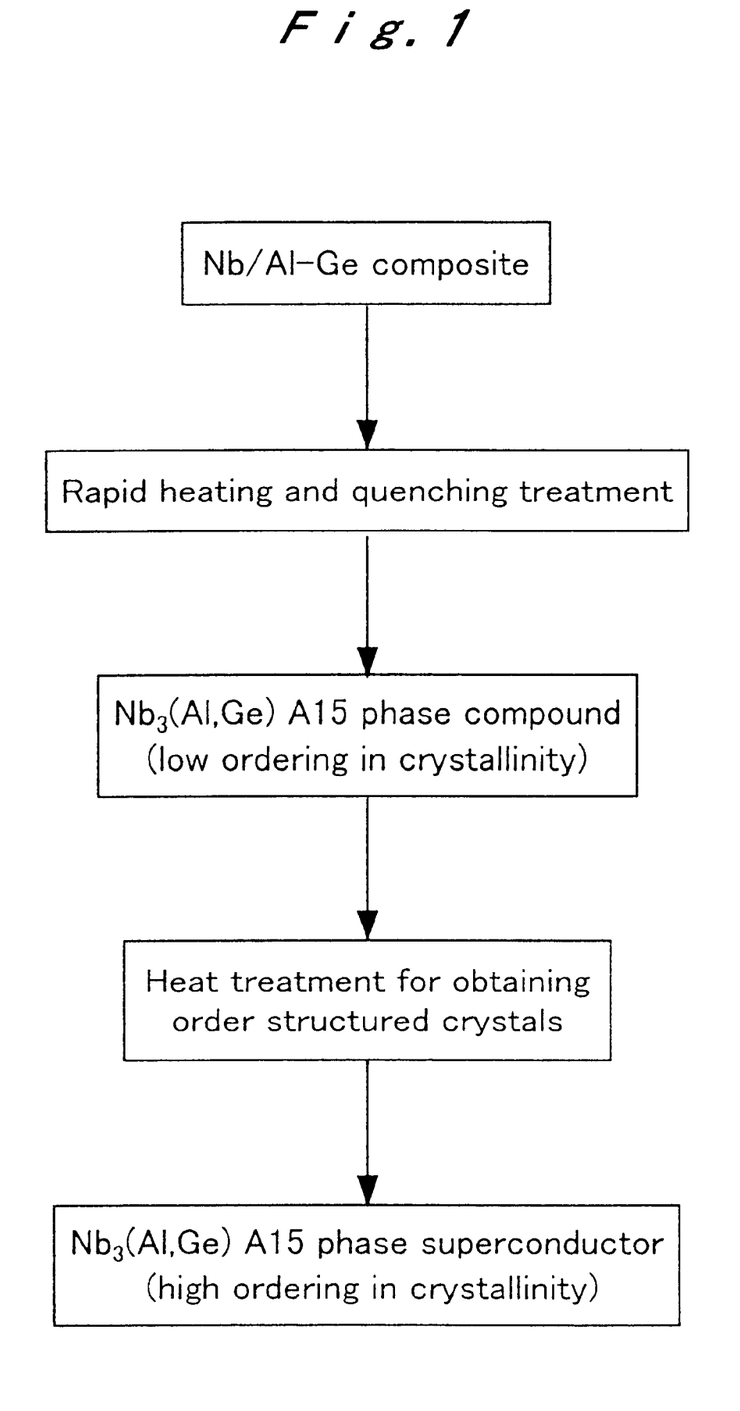
FIG. 1 is a schematically drawn diagram showing the process flow for a fabrication process according to the present invention based on rapid heating and quenching.

Then, as shown in FIG. 1, the ultrafine multifilamentary composite wires of Al—Ge alloy embedded in Nb matrix (referred to hereinafter as Nb/Al—Ge) were each subjected to rapid heating and quenching treatment to obtain a $Nb_3$(Al—Ge) - A15 phase compound having a low order of crystallinity, and by applying post heat treatment to increase the degree of ordering, $Nb_3$(Al—Ge) - A15 phase superconductors having a high ordering degree of crystallinity were finally obtained.

Figure 5:
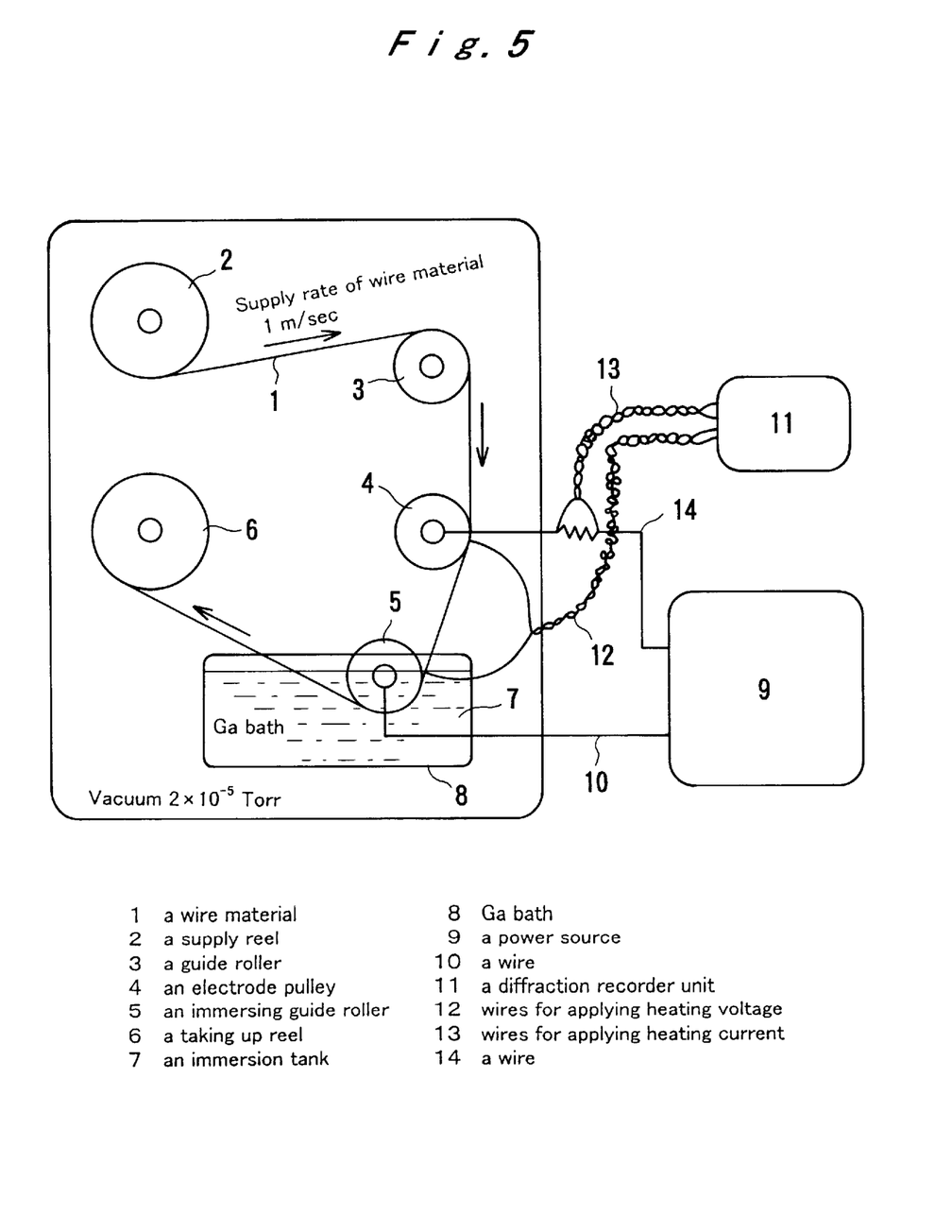
FIG. 5 is a schematically drawn diagram showing an apparatus for the rapid heating and quenching treatment.
Figure 6:
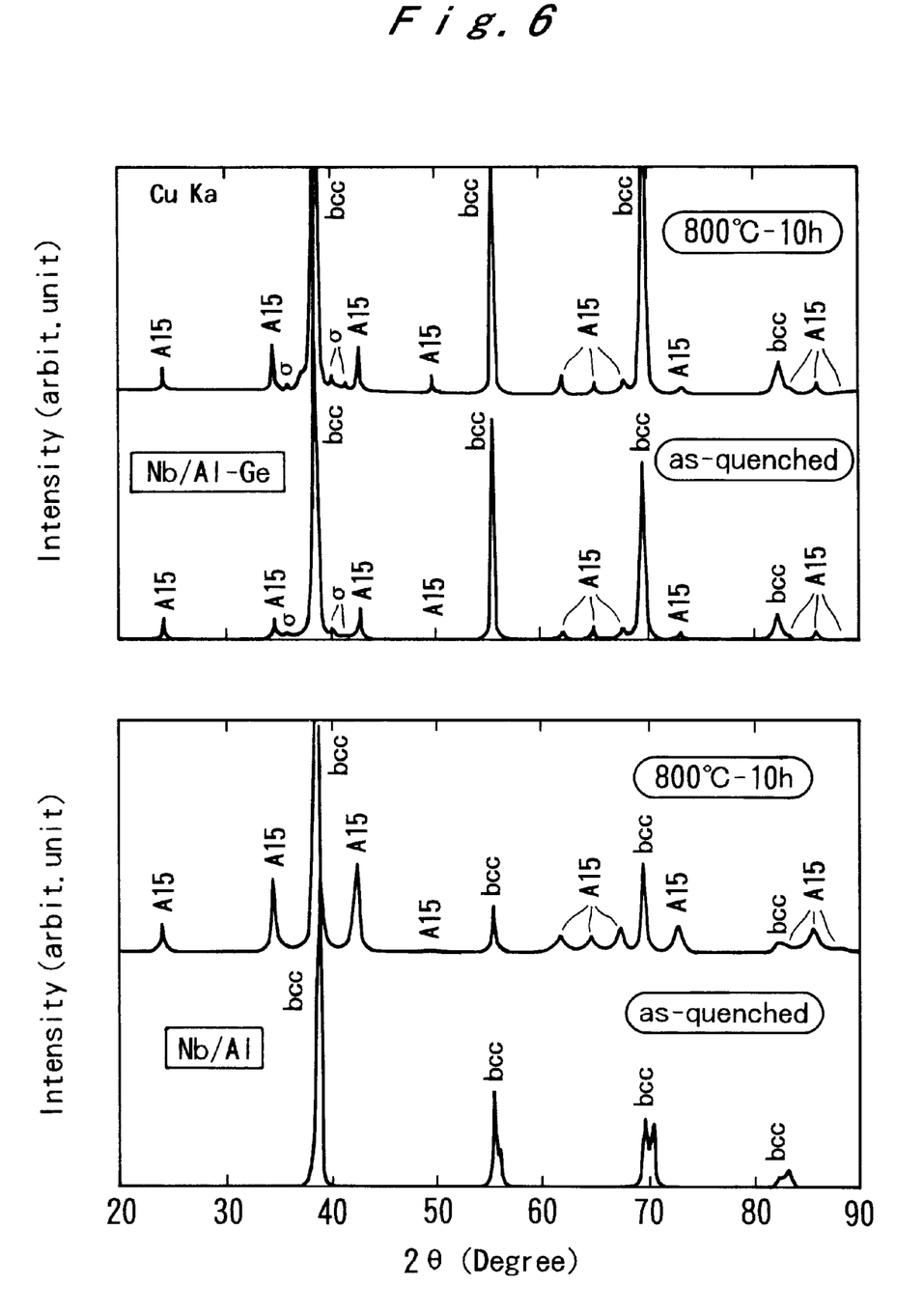
FIG. 6 shows X-ray diffractograms for wire materials obtained by applying rapid heating and quenching treatment to a Nb/Al composite wire and a Nb/Al—20% at. Ge composite wire, and for wire materials obtained by further applying a post heat treatment to the resulting wire materials at 800° C. for a duration of 10 hours.

The composite wires were treated in a rapid heating and quenching apparatus as shown in FIG. 5.

The rapid heating and quenching apparatus is used for electric heating and Ga bath cooling of a wire material 1, and comprises a unit for supplying the wire material, a taking up mechanism, a Ga bath, a diffraction recorder unit, and a power source. More specifically, the wire material 1 supplied from a supply reel 2 was finally taken up by a taking up reel 6, via a guide roller 3, an electrode pulley 4, and an immersing guide roller 5. The electrode pulley 4 and the immersing guide roller 5 were each connected to a power source 9 by wires 14 and 10, and the recorder unit 11 was connected to the electrode pulley 4 and the immersing guide roller 5 via wires for applying heating voltage 12 and wires for applying heating current 13. An immersion tank 7 was filled with Ga solution, into which the immersing guide roller 5 was immersed.

By using these apparatus, the wire material 1 was rapidly heated while passing through the electrode pulley 4 under control of the recorder unit 11, and was quenched while passing through the Ga solution.

The composite wire, while being moved at a rate of 1m/sec from the electrode pulley 4 to a Ga bath, was rapidly heated from room temperature to about 2,000° C. by electric heating. The wire was then quenched by passing through the Ga bath whose temperature was maintained to about 5° C.; therefore, the cooling rate was about 1×10⁵ ° C./sec. The Ga bath functions as the electrode and the cooling mechanism.

Figure 2:
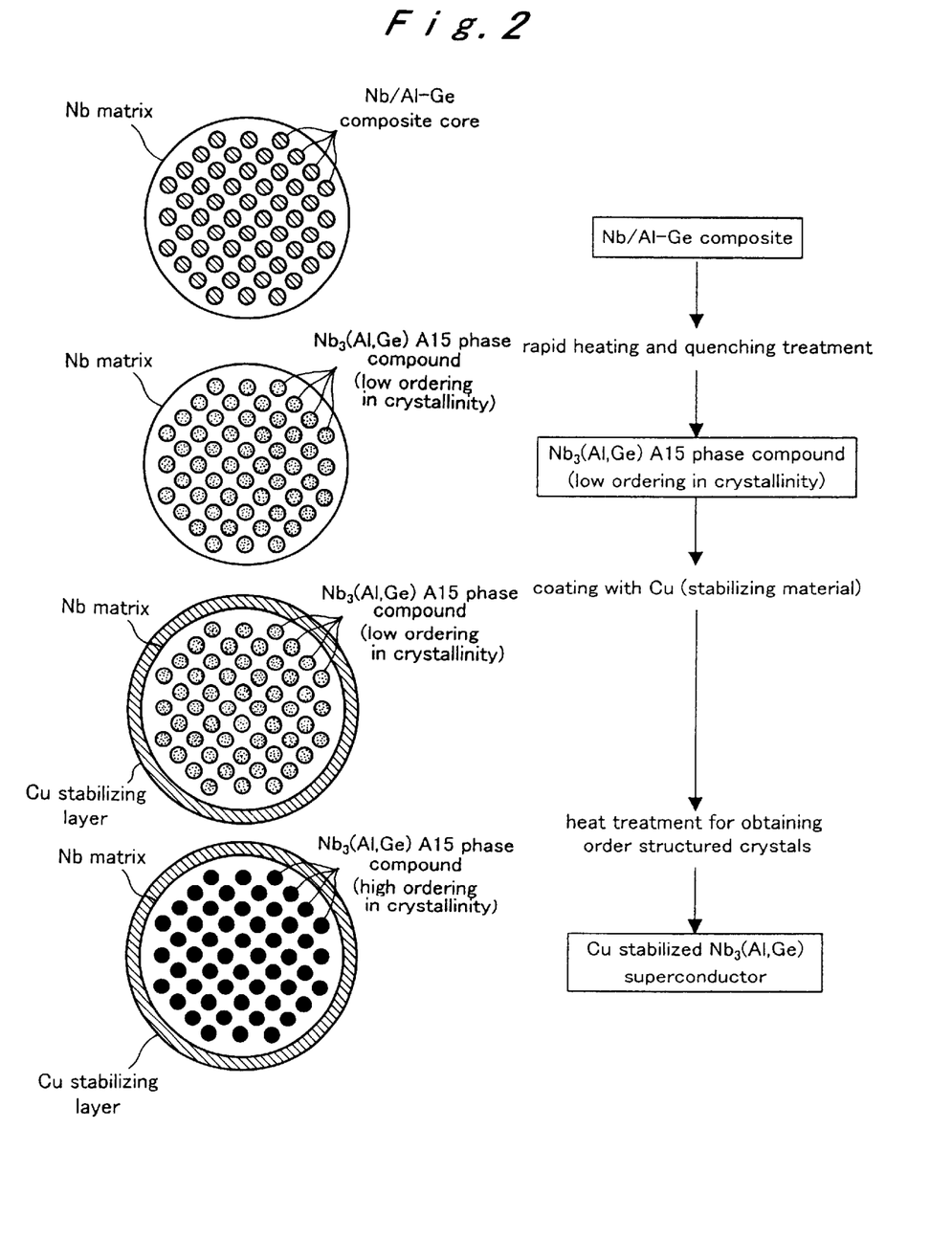
FIG. 2 is a schematically drawn process flow for a fabrication process according to an embodiment of the present invention.

As shown in FIG. 2, then with a A-15 phase filament having a lower order in crystallinity formed inside the composite wire, the composite wire was coated, via electrical plating, chemical plating or physical plating, with copper (Cu) which functions as a stabilizing material of superconductivity.

The resulting composite wire was subjected to the subsequent heat treatment for having an order of crystalling, so as to obtain a composite wire comprising a Cu stabilized $Nb_3$(Al,Ge) superconductor having a high order of crystallinity.

Figure 3:
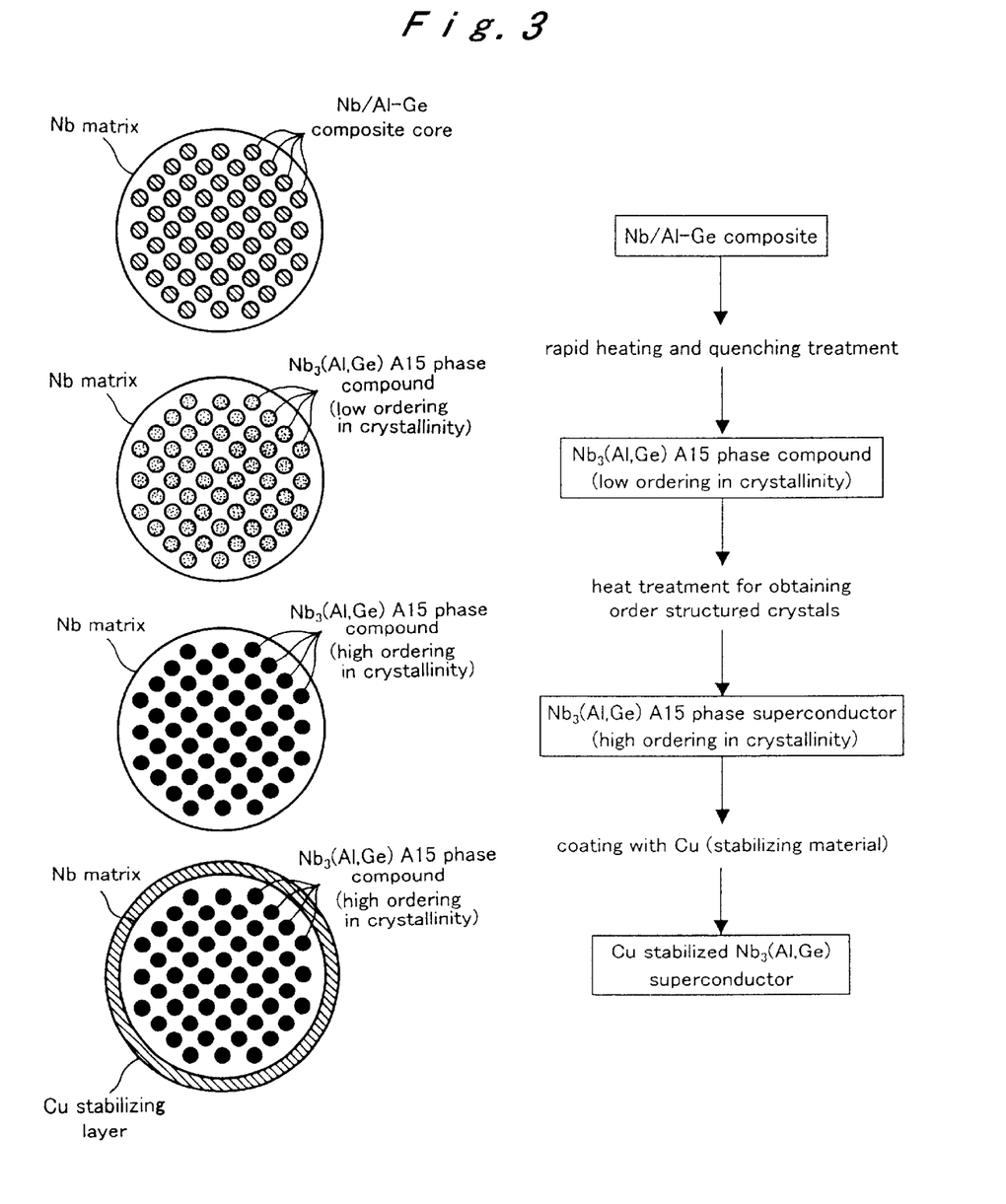
FIG. 3 is a schematically drawn process flow for a fabrication process according to another embodiment of the present invention.

The step of Cu coating for stabilization in this example was carried out after the rapid heating and quenching treatment and prior to the post heat treatment. However, as shown in FIG. 3, Cu coating may be applied after obtaining the highly ordered $Nb_3$(Al,Ge) - A15 phase superconductor by heat treatment.

Figure 4:
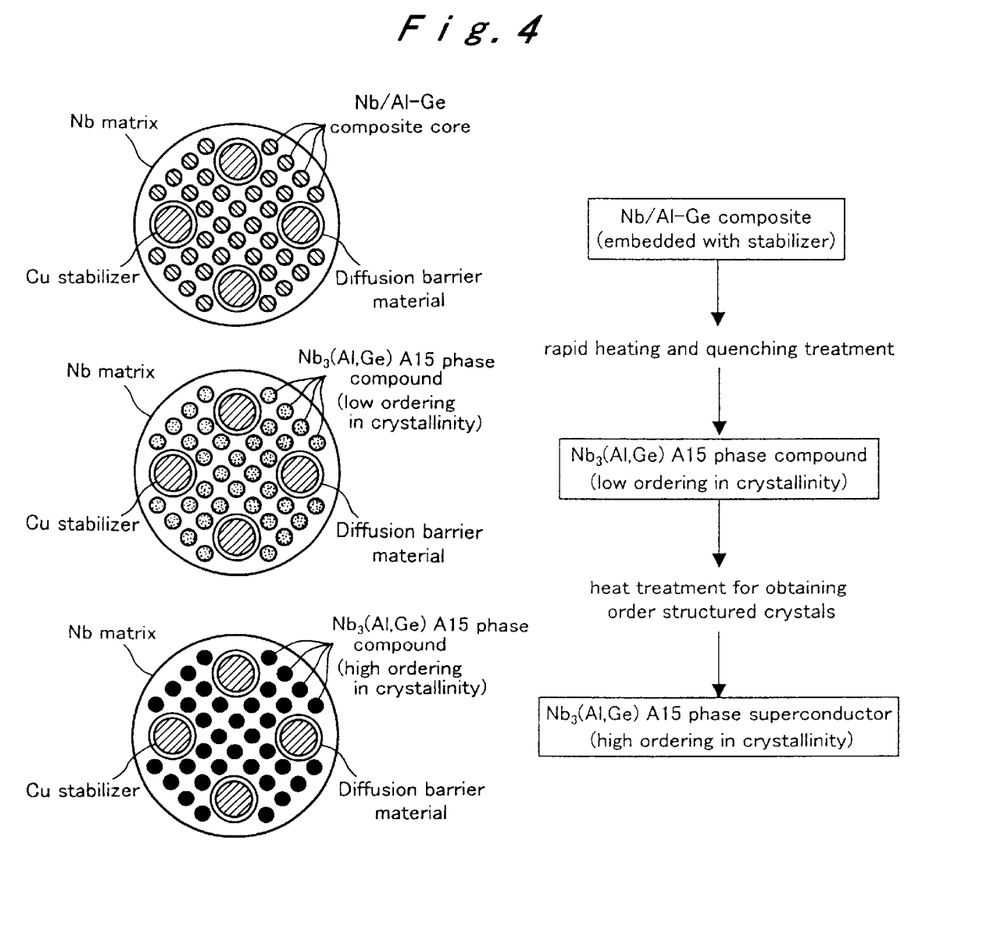
FIG. 4 is a schematically drawn process flow for a fabrication process according to a still other embodiment of the present invention.

Furthermore, in the step of fabricating the composite wire material with reference to FIG. 4, Cu may be incorporated in advance into the matrix in a state surrounded by a diffusion barrier material such a V, Nb, Ta, etc. Then, the ultrafine multifilamentary composite wire can be fabricated by wire drawing, and subjecting the rapid heating and quenching treatment.

The thus taken up composite wire was identified by using an X-ray diffractometer. As a shown in FIG. 5, A15 phase compounds were observed to generate. This fact can be clearly contrasted to the case using a Nb/Al wire material free from Ge, applying rapid heating and quenching, which observed a supersaturated bcc solid solution phase.

Figure 7:
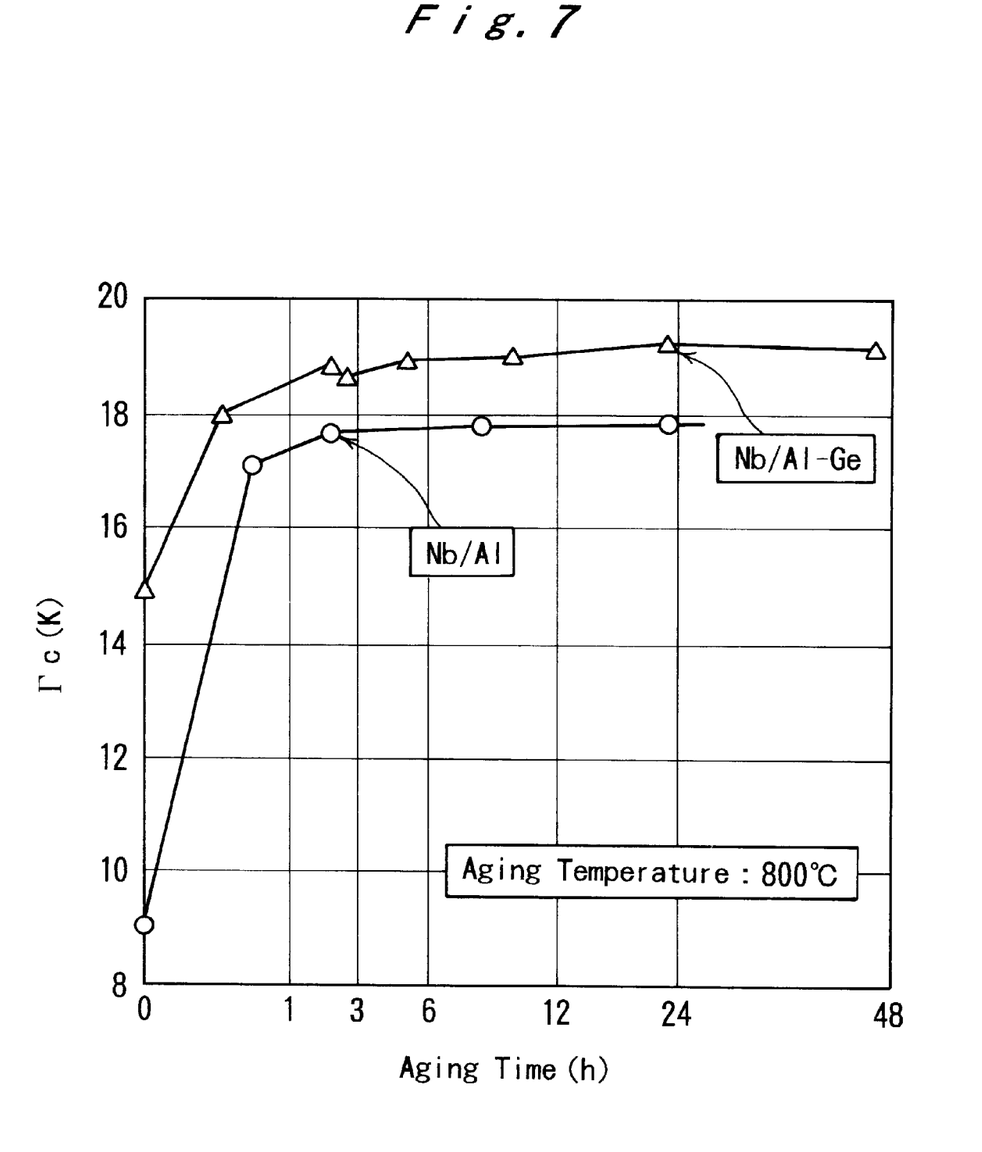
FIG. 7 is a diagram showing the change in $T_C$ after applying the post heat treatment to a Nb/Al composite wire and a Nb/Al—20% at. Ge composite wire.

For Nb/Al—20 at. % Ge, as shown in FIG. 7, the $T_C$ after rapid heating and quenching treatment of 14.9 K was increased to 19.4 K by applying post heat treatment (aging) at 800° C., because the long range ordering of the crystal was recovered.

Since the maximum $T_C$ available by a Ge-free Nb/Al was 17.5 K, the addition of Ge was found to increase the $T_C$ by about 2 K.

For the Nb/Al—5 at. % Ge and Nb/Al—30 at. % Ge, maximum $T_C$ of 18.3 K and 18.7 K, respectively, were obtained.

Similarly, although the $H_{C2}$(4.2 K) for Nb/Al—20 at. % Ge was about 20 T upon applying rapid heating and quenching, this value was found to increase to a range of from 30 to 40 T by applying post heat treatment at a temperature in the range of from 650 to 900 ° C. Concerning that the $H_{C2}$(4.2 K) for a Ge-free Nb/Al was in the range of 25 to 26 T, the addition of Ge was found to greatly increase the value of $H_{C2}$(4.2 K).

Figure 8:
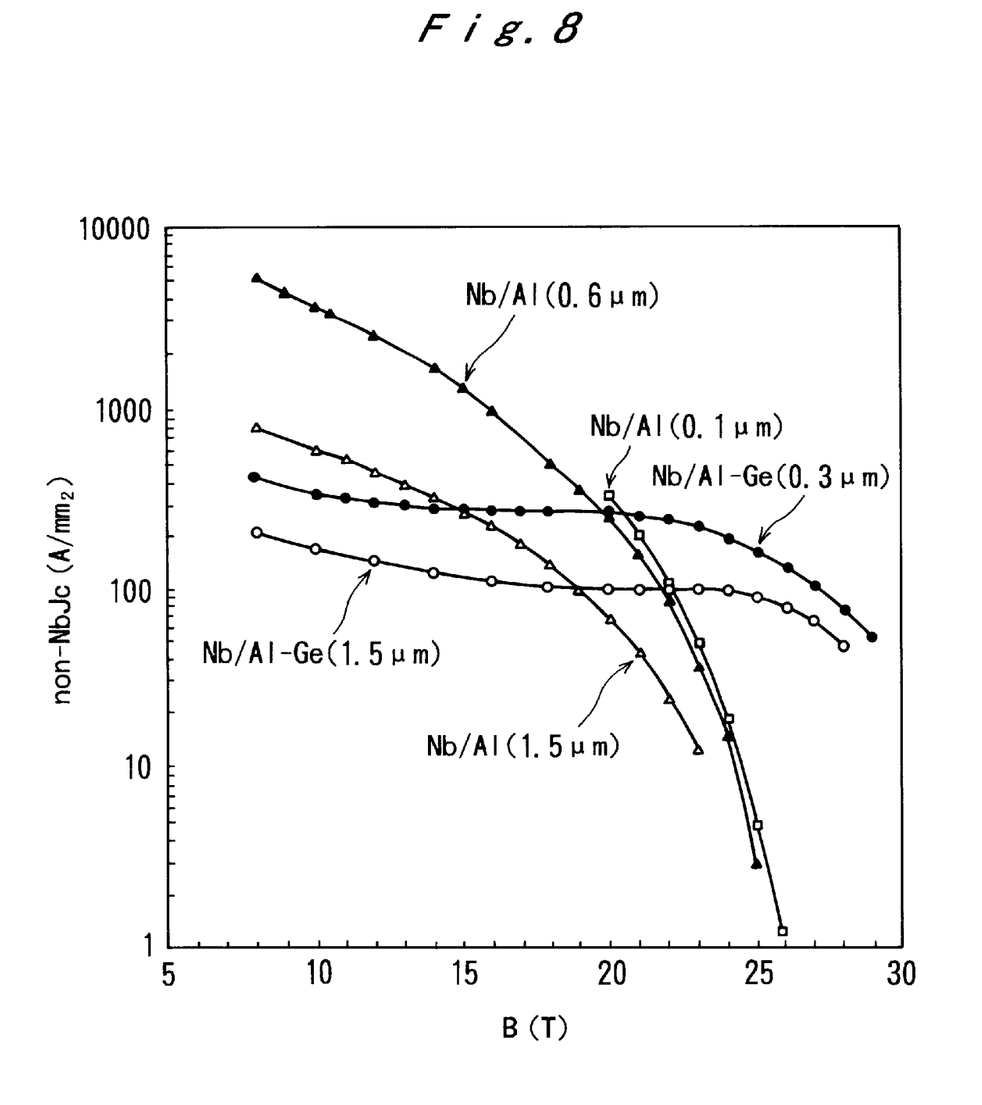
FIG. 8 is a diagram showing the $J_C$ - B characteristics of Nb/Al composite wires and Nb/Al—20% at. Ge composite wires differed in diameter of core materials.

The Ge-added wire material was found to be greatly improved in $T_C$ and $H_{C2}$(4.2 K) values, but as shown in FIG. 8, the $J_C$(4.2 K) is not so high in the lower magnetic fields. The practically useful superconducting wire materials yield an extremely low $J_C$, but exhibit a considerable high value under magnetic fields as high as 20 T or even higher. In particular, the 330×330 multifilamentary Nb/Al—20 at. % Ge composite wire (comprising 0.3 μm diameter Al—Ge alloy filaments) yields a $J_C$(4.2 K) of over 250 A/mm² under a magnetic field of 25 T, and achieves a $J_C$(4.2 K) of 150 A/mm² under a magnetic field of 25 T. Accordingly, the results suggest that a super-high magnetic field of 25 T at 4.2 K and 27 T at 1.8 K is available (i.e., the superconducting characteristics are improved by about 2 T by cooling from 4.2 K to 1.8 K) by optimally designing a superconducting magnet using the $Nb_3$(Al,Ge) ultrafine multifilamentary wire material.

For the cases using Nb/Al—5 at. % Ge and Nb/Al—30 at. % Ge, although not so distinct as in the case for Nb/Al—20 at. % Ge, improvements were similarly observed in high magnetic field characteristics. For both cases, greater improvements in $J_C$(4.2 K) values were found for the 330×330 multifilamentary wire (0.3 μm in filament diameter) as compared with the 121 ×121 multifilamentary wire (1.5 μm in filament diameter).

Example 2

As an example of adding Si, Al alloys containing 3 at. % Si, 10 at. % Si, 20 at. % Si, and 30 at. % Si (referred to hereinafter as Al—3 at. % Si, Al—10 at. % Si, Al—20 at. % Si, Al—30 at. % Si, respectively) were each prepared by Tanmann melting, and multifilamentary composite wires 0.8 mm in outer diameter and containing 121×121 Al—Si alloy filaments and 330×330 Al—Si alloy filaments were fabricated in the same manner as that described in Example 1. Similarly, the resulting multifilamentary composite wires were subjected to rapid heating and quenching, and to the subsequent post heat treatment to evaluate the superconducting characteristics thereof.

By X-ray diffraction, A15 phase compound filaments having low degree of crystallinity were found to be formed by rapid heating and quenching.

The $T_C$ after rapid heating and quenching was found to be in the range of a bout 13 to 15 K for all the specimens. After subjecting the specimens to post heat treatment (aging) at 800° C., the $T_C$ values was observed improving, and the most distinct improvement was on the case using an Al alloy containing 10 at. % Si (Nb/Al—10 at. % Si,) which yielded 18.8 K.

In the case of adding 3 at. % Si and 20 % Si, the $T_C$ values were improved to 18.2 K and 18.1 K, but for the case of adding 30 at. % Si, the maximum $T_C$ value obtained was found to be 17.2 K, i.e., a value lower than the maximum $T_C$ of 17.9 K obtained for the Si-free specimen.

The $J_C$(4.2 K) values obtained for the case of using Nb/Al—10 at. % Si exhibited a magnetic field dependency extremely similar to that obtained for Nb/Al—20 at. % Ge. More specifically, similar to the case of adding Ge, the $J_C$(4.2 K) values were higher for the 0.3 μm diameter filaments as compared with the filaments 1.5 μm in diameter; that is, a $J_C$(4.2 K) of 150 A/mm² was obtained under a magnetic field of 24 T.

It can be understood from the above results that the $Nb_3$(Al,Si) ultrafine multifilamentary wires are promising as superconducting wires for generating a magnetic field of 24 T under operation at 4.2 K, and a magnetic field of 26 T under operation of 1.8 K.

As described above, the present invention provides $Nb_3$Al ultrafine multifilamentary wires improved in $T_C$ and $H_{C2}$ values by adding Ge or Si, and furthermore capable of yielding high $J_C$; it enables the production of superconducting wire materials capable of generating high magnetic fields in the level of 27 T.

The present invention provides a production process capable of obtaining practically useful wire materials for the $Nb_3$(Al,Ge) and $Nb_3$(Al,Si) compounds whose process for fabricating wires were not known despite their excellent superconducting characteristics, and thereby realizes a high critical current density $J_C$.

The superconducting wire materials fabricated by the present invention which makes high critical current density available, and enables the generation of a conventionally unfeasible super high magnetic field in the range of from 25 to 27 T. Thus, they are regarded promising to applications such as nuclear fusion furnace magnets, electromagnetic propulsion vessels, NMR spectrometers of 1.1 GHz, etc. Furthermore, it may lead to the generation of a completely novel application technology, and is therefore expected to bring about a large economical effect.

While the invention has been described in detail by making reference to specific examples, it should be understood that various changes and modifications can be made without departing from the scope and the spirit of the present invention.

What is claimed is:

1. A process for producing an ultrafine multifilamentary super conductive $Nb_3(Al,Ge)$ wire comprising:
   a. preparing a composite core material comprising an Al—(2–30)at. % Ge alloy, where at. % represents atomic percent of 1 μm or less in thickness, uniformly incorporated into a Nb matrix at a volume ratio in the range of 1:2.5 to 1:3.5 and forming a composite therewith;
   b. fabricating a composite wire having an ultrafine multifilamentary structure by embedding a plurality of the resulting composite core materials in a cylindrical matrix material containing Nb;
   c. forming an A15-phase filament having a lower order of crystallinity inside the composite wire having the ultrafine multifilamentary structure than the order of such crystallinity in the resulting product of this process, by a rapid heating and quenching treatment comprising rapidly heating the composite wire having the ultrafine multifilamentary structure to a temperature of 1,700° C. or higher in 2 seconds, followed by continuously introducing it into a molten metal;
   d. coating the composite wire having the ultrafine multifilamentary structure in the state above with copper (Cu) which functions as a superconductivity stabilizing material; and
   e. applying a post heat treatment in the temperature range of from 650 to 900° C. to the resulting product to increase the order of crystallinity of the $Nb_3(Al,Ge)$ of the A15 compound.

2. A process for producing an ultrafine multifilamentary superconductive $Nb_3(Al,Si)$ wire, comprising:
   a. preparing a composite core material comprising an Al—(2–20)at. % Si alloy, where at. % represents atomic percent, of 1 μm or less in thickness, uniformly incorporated into an Nb matrix at a volume ratio in a range of 1:2.5 to 1:3.5 and forming a composite therewith;
   b. fabricating a composite wire having an ultrafine multifilamentary structure by embedding a plurality of the resulting composite core materials in a cylindrical matrix material containing Nb;
   c. forming an A15-phase filament having a lower order of crystallinity inside the composite wire having the ultrafine multifilamentary structure than the order of such crystallinity in the resulting product of this process, by a rapid heating and quenching treatment comprising rapidly heating the composite wire having the ultrafine multifilamentary structure to a temperature of 1,700° C. or higher in 2 seconds, followed by continuously introducing it into a molten metal;
   d. coating the composite wire having the ultrafine multifilamentary structure in the state above with copper (Cu) which functions as a superconductivity stabilizing material; and
   e. applying a post heat treatment in the temperature range of from 650 to 900° C. to the resulting product to increase the order of crystallinity of the $Nb_3(Al,Si)$ of the A15 compound.

3. A process for producing an ultrafine multifilamentary superconductive $Nb_3(Al,Ge)$ wire comprising:
   a. preparing a composite core material comprising an Al—(2–30)at. % Ge alloy, where at. % represents atomic 1 percent, of μm or less in thickness, uniformly incorporated into an Nb matrix at a volume ratio in a range of 1:2.5 to 1:3.5 and forming a composite therewith;
   b. fabricating a composite wire having an ultrafine multifilamentary structure by embedding a plurality of the resulting composite core materials in a cylindrical matrix material containing Nb;
   c. forming an A15-phase filament having a lower order of crystallinity inside the composite wire having the ultrafine multifilamentary structure than the order of such crystallinity in the resulting product of this process, by a rapid heating and quenching treatment comprising rapidly heating the composite wire having the ultrafine multifilamentary structure to a temperature of 1,700° C. or higher in 2 seconds, followed by continuously introducing it into a molten metal;
   d. applying a post heat treatment in the temperature range of from 650 to 900° C. to the resulting product to increase the order of crystallinity of the $Nb_3(Al,Ge)$ of the A15 compound; and
   e. coating the composite wire having the ultrafine multifilamentary structure in the state above with copper (Cu) which functions as a superconductivity stabilizing material.

4. A process for producing an ultrafine multifilamentary superconductive $Nb_3(Al,Si)$ wire, comprising:
   a. preparing a composite core material comprising an Al—(2–20)at. % Si alloy, where at. % represents atomic percent, of 1 μm or less in thickness, uniformly incorporated into an Nb matrix at a volume ratio in a range of 1:2.5 to 1:3.5 and forming a composite therewith;
   b. fabricating a composite wire having an ultrafine multifilamentary structure by embedding a plurality of the resulting composite core materials in a cylindrical matrix material containing Nb;
   c. forming an A15-phase filament having a lower order of crystallinity inside the composite wire having the ultrafine multifilamentary structure than the order of such crystallinity in the resulting product of this process, by a rapid heating and quenching treatment comprising rapidly heating the composite wire having the ultrafine multifilamentary structure to a temperature of 1,700° C. or higher in 2 seconds, followed by continuously introducing it into a molten metal;
   d. applying a post heat treatment in the temperature range of from 650 to 900° C. to the resulting product to increase the order of crystallinity of the $Nb_3(Al,Si)$ of the A15 compound;
   e. coating the composite wire having the ultrafine multifilamentary structure in the state above with copper (Cu) which functions as a superconductivity stabilizing material.

5. A process for producing an ultrafine multifilamentary superconductive $Nb_3(Al,Ge)$ wire comprising:

a. preparing a composite core material comprising an Al—(2–30)at. % Ge alloy, where at. % represents atomic percent, of 1 μm or less in thickness, uniformly incorporated into a Nb matrix at a volume ratio in a range of 1:2.5 to 1:3.5 and forming a composite therewith;

b. fabricating a composite wire having an ultrafine multifilamentary structure, by imbedding a plurality of the resulting composite core materials and copper surrounded with a diffusion barrier in a cylindrical matrix material containing Nb;

c. forming an A15-phase filament having a lower order of crystallinity inside the composite wire having the ultrafine multifilamentary structure than the order of such crystallinity in the resulting product of this process, by a rapid heating and quenching treatment comprising rapidly heating the composite wire having the ultrafine multifilamentary structure to a temperature of 1,700° C. or higher in 2 seconds, followed by continuously introducing it into a molten metal; and d. applying a post heat treatment in the temperature range of from 650 to 900° C. to the resulting product to increase the order of crystallinity of the $Nb_3(Al,Ge)$ of the A15 compound.

6. A process for producing an ultrafine multifilamentary superconductive $Nb_3(Al,Si)$ wire, comprising:

a. preparing a composite core material comprising an Al—(2–20)at. % Si alloy, where at. % represents atomic percent, of 1 μm or less in thickness, uniformly incorporated into an Nb matrix at a volume ratio in a range of 1:2.5 to 1:3.5 and forming a composite therewith;

b. fabricating a composite wire having an ultrafine multifilamentary structure, by imbedding a plurality of the resulting composite core materials and copper surrounded with a diffusion barrier in a cylindrical matrix material containing Nb;

c. forming an A15-phase filament having a lower order of crystallinity inside the composite wire having the ultrafine multifilamentary structure than the order of such crystallinity in the resulting product of this process, by a rapid heating and quenching treatment comprising rapidly heating the composite wire having the ultrafine multifilamentary structure to a temperature of 1,700° C. or higher in 2 seconds, followed by continuously introducing it into a molten metal; and d. applying a post heat treatment in the temperature range of from 650 to 900° C. to the resulting product to increase the order of crystallinity of the $Nb_3(Al,Si)$ of the A15 compound.

7. A process for producing an ultrafine multifilamentary superconducting $Nb_3(Al,Ge)$ wire comprising:

a. preparing a composite core comprising an Al—(2–30) at. % Ge—(0–7)at. % X, where at. % represents atomic percent and where X represents at least one element selected from the group consisting of Mg, Zn, Li, Ag, Cu and B, of 1 μm or less in thickness, uniformly incorporated into an Nb matrix at a volume ratio in a range of 1:2.5 to 1:3.5 and forming a composite therewith;

b. fabricating a composite wire having an ultrafine multifilamentary structure by embedding a plurality of the resulting composite core materials in a cylindrical matrix material containing Nb;

c. forming an A15-phase filament having a lower order of crystallinity inside the composite wire having the ultrafine multifilamentary structure than the order of such crystallinity in the resulting product of this process, by a rapid heating and quenching treatment comprising rapidly heating the composite wire having the ultrafine multifilamentary structure to a temperature of 1,700° C. or higher in 2 seconds, followed by continuously introducing it into a molten metal;

d. coating the composite wire having the ultrafine multifilamentary structure in the state above with copper (Cu) which functions as a superconductivity stabilizing material; and e. applying a post heat treatment in the temperature range of from 650 to 900° C. to the resulting product to increase the order of crystallinity of the $Nb(Al,Ge)$ of the A15 compound.

8. A process for producing an ultrafine multifilamentary superconducting $Nb_3(Al,Si)$ wire comprising:

a. preparing a composite core comprising an Al—(2–20) at. % Si—(0–7)at % X, where at. % represents atomic % and where X represents at least one element selected from the group consisting of Mg, Zn, Li, Ag, Cu and B, of 1 μm or less in thickness, uniformly incorporated into a Nb matrix at a volume ratio in a range of 1:2.5 to 1:3.5 and forming a composite therewith;

b. fabricating a composite wire having an ultrafine multifilamentary structure by embedding a plurality of the resulting composite core materials in a cylindrical matrix material containing Nb;

c. forming an A15-phase filament having a lower order of crystallinity inside the composite wire having the ultrafine multifilamentary structure than the order of such crystallinity in the resulting product of this process, by a rapid heating and quenching treatment comprising rapidly heating the composite wire having the ultrafine multifilamentary structure to a temperature of 1,700° C. or higher in 2 seconds, followed by continuously introducing it into a molten metal;

d. coating the composite wire having the ultrafine multifilamentary structure in the state above with copper (Cu) which functions as a superconductivity stabilizing material; and e. applying a post heat treatment in the temperature range of from 650 to 900° C. to the resulting product to increase the order of crystallinity of the $Nb_3(Al,Si)$ of the A15 compound.

* * * * *